United States Patent
Rieger

(10) Patent No.: US 7,800,911 B2
(45) Date of Patent: Sep. 21, 2010

(54) FASTENING ELEMENT

(75) Inventor: Robby Rieger, Karlsbad-Ittersbach (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 398 days.

(21) Appl. No.: 11/782,089

(22) Filed: Jul. 24, 2007

(65) Prior Publication Data

US 2008/0019107 A1 Jan. 24, 2008

(30) Foreign Application Priority Data

Jul. 24, 2006 (EP) .................................. 06015386

(51) Int. Cl.
*H05K 7/00* (2006.01)
(52) U.S. Cl. .................. 361/729; 361/799; 361/807
(58) Field of Classification Search .................. 361/729, 361/803, 807, 810, 760, 720, 736, 799, 794
See application file for complete search history.

(56) References Cited

U.S. PATENT DOCUMENTS

| | | | |
|---|---|---|---|
| 5,786,989 A | 7/1998 | Kawabe | 361/759 |
| 5,880,937 A * | 3/1999 | Schadhauser et al. | 361/794 |
| 6,186,800 B1 * | 2/2001 | Klein et al. | 439/95 |
| 6,930,734 B2 * | 8/2005 | Lee | 349/58 |
| 7,561,433 B2 * | 7/2009 | Wright et al. | 361/747 |

FOREIGN PATENT DOCUMENTS

| | | |
|---|---|---|
| DE | G 8213627.0 | 8/1982 |
| DE | 20316262 | 12/2003 |
| EP | 0889683 | 1/1999 |
| JP | 08-069826 | 3/1996 |

* cited by examiner

*Primary Examiner*—Hung S Bui
(74) *Attorney, Agent, or Firm*—The Eclipse Group LLP

(57) ABSTRACT

A fastening element for connecting a housing to a printed circuit board comprises a first surface having a through hole for receiving a connecting element for connecting the fastening element to the housing, at least one first mounting pin extending from the first surface for mounting the fastening element to the printed circuit board, a second surface from which a second mounting pin extends for mounting a fastening element to the printed circuit board and a third surface connecting the first surface and the second surface.

22 Claims, 5 Drawing Sheets

FASTENING ELEMENT

RELATED APPLICATIONS

This application claims priority of European Patent Application Serial Number 06 015 386.3, filed on Jul. 24, 2006, titled FASTENING ELEMENT, which is incorporated in its entirety by reference in this application.

BACKGROUND OF THE INVENTION

1. Field of the Invention

The invention relates to a fastening element, a connection system, and a method for connecting a housing to a printed circuit board.

2. Related Art

In many electronic devices, a printed circuit board has to be connected to or housed in a housing. Additionally, if the device is sensitive to electromagnetic radiation or emits electromagnetic radiation, for example, in car radio devices, shieldings have to be attached to the PCB and/or the housing. Releasable connections, for example screwed connections, are preferred, as this simplifies maintenance and repair actions. Several connection methods for connecting a housing, a printed circuit board, and optionally a shielding are known in the art, but they all suffer from various disadvantages.

For example, soldering the shielding to the printed circuit board and connecting the shielding to the housing has certain disadvantages. First, when connecting the shielding with a self-tapping screw through a hole in the housing and a thread cut by the screw in the shielding, as the shielding plates are normally rather thin, there is a great risk of overwinding the screw due to the low mechanical strength of the thin shielding plate. As an alternative an insert nut can be inserted into the shielding, but this increases the cost of production and complicates the production process. Furthermore, the connection of the printed circuit board to the housing via the shielding is not very reliable, as the shielding might tear due to mechanical loads and vibrations.

Connecting the printed circuit board to the housing via a screw extending through a hole in the printed circuit board into a thread of the housing is only possible if the printed circuit board and the surface of the housing to which the printed circuit board has to be connected to, are in parallel. If the printed circuit board and the surface of the housing are perpendicular in the area where they have to be connected, a threaded protrusion has to be provided at the housing, which increases production costs and makes the production process of the housing more complicated. Furthermore, a separate connection has to be provided for an optional shielding. Moreover, it is common for the above-mentioned connecting methods to be difficult to implement in automated production process.

Therefore, a need exists for providing a fastening element for connecting a housing to a printed circuit board that provides a releasable and reliable connection between a printed circuit board and a housing that is capable of optionally including the connection to a shielding, and which is capable of being processed automatically by a mounting tool or a robot.

SUMMARY

A fastening element for connecting a housing to a printed circuit board is provided. The fastening element comprises a first surface having a through hole for receiving a connecting element connecting the fastening element to the housing and at least one first mounting pin extending from the first surface for mounting the fastening element to the printed circuit board. Additionally, a second surface is provided from which a second mounting pin extends for mounting the fastening elements to the printed circuit board, and a third surface connecting the first and the second surfaces. The third surface comprises a planar section providing a grasp surface for a mounting tool or a robot for mounting the fastening elements to the printed circuit board.

According to another example of an implementation, a connecting system for connecting a printed circuit board to a shielding plate and a housing is provided. The connecting system comprises a housing having a through hole for receiving a connecting element, a shielding plate having a through hole for receiving the connecting element, and a fastening element having mounting pins for mounting the fastening element to the printed circuit board and a first surface having a hole for receiving the connecting element.

According to another example of an implementation of the invention, a method is provided for connecting a housing, a shielding plate and a printed circuit board. The method comprises the steps of mounting a fastening element to the printed circuit board, arranging a surface of the housing, the shielding plate and one surface of the fastening element to form a layered structure so that the shielding plate is sandwiched between the surface of the housing and said surface of the fastening element, aligning the surface of the housing, the shielding plate and the fastening element so that through holes of the surface of the housing, the shielding plate and the surface of the fastening element form one through hole through the layered structure, connecting the surface of the housing, the shielding plate and the fastening element with a connecting element passing through the one through hole of the layered structure.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention may be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Figure 1:
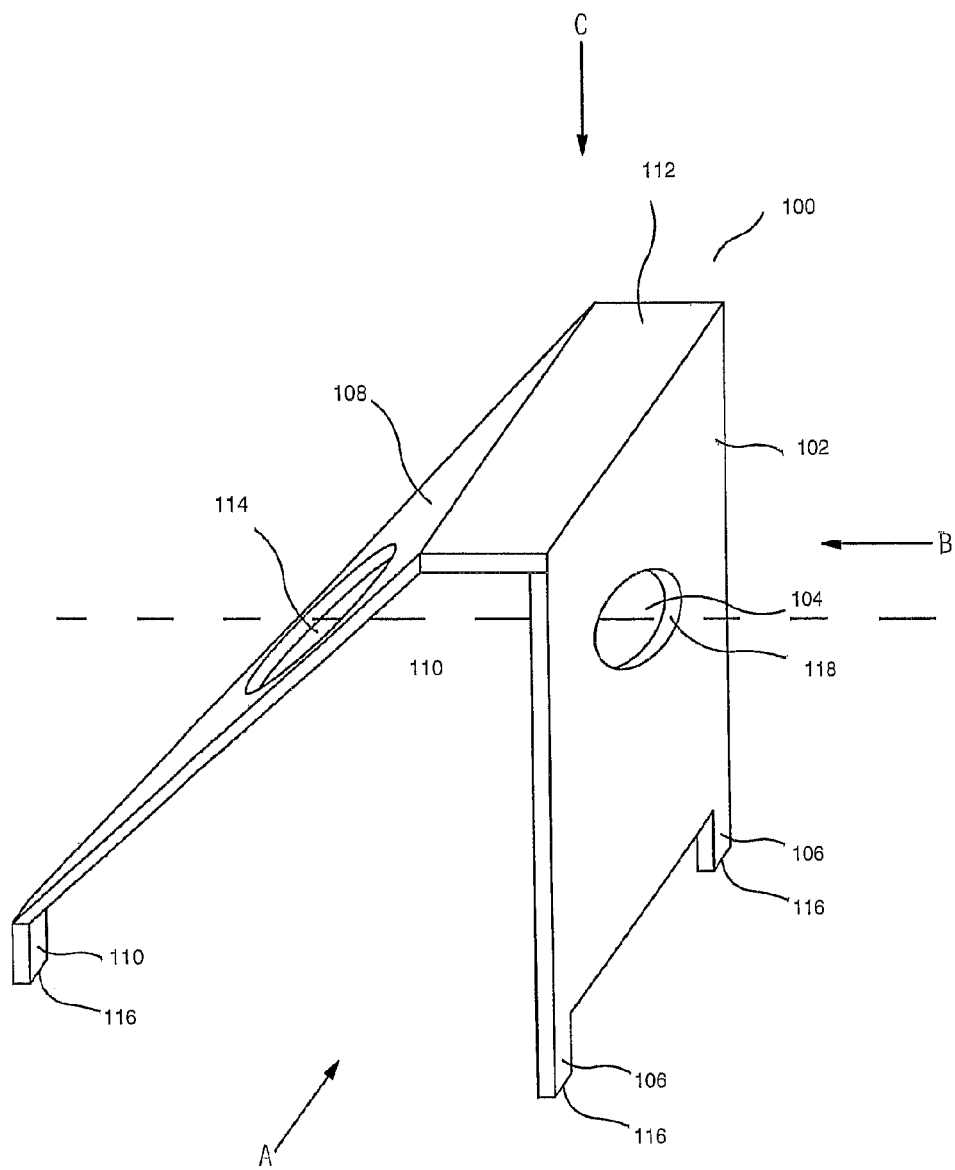
FIG. 1 illustrates a perspective view of one example of an implementation of a fastening element.

FIG. 1 illustrates a perspective view of one example of an implementation of a fastening element 100. As illustrated in FIG. 1, the fastening element 100 includes a first surface 102 having a through hole 104 for receiving a connecting element (FIG. 5) for connecting the fastening element 100 to a housing (FIG. 5) as described further below.

Figure 3:
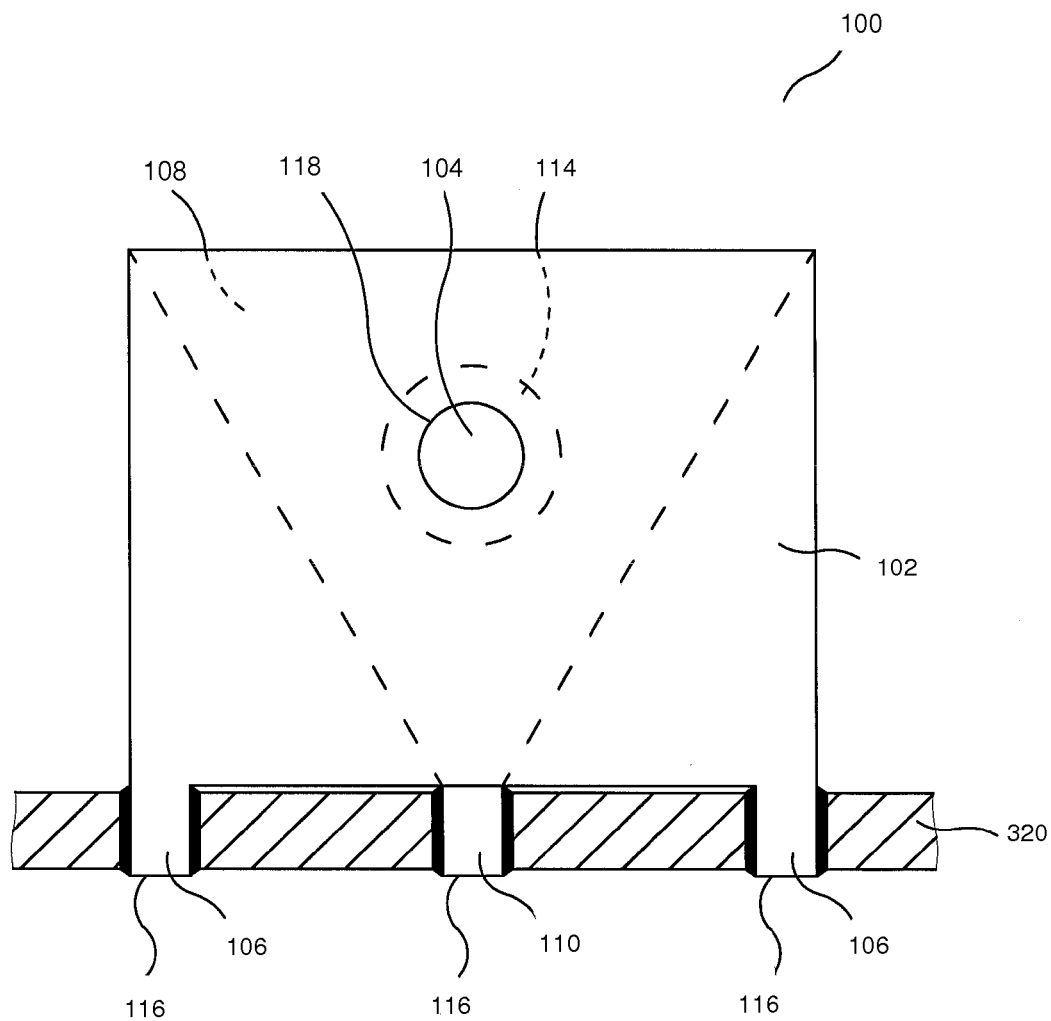
FIG. 3 illustrates a front view of the fastening element of FIG. 1 viewed from the direction indicated by arrow B in FIG. 1.
Figure 4:
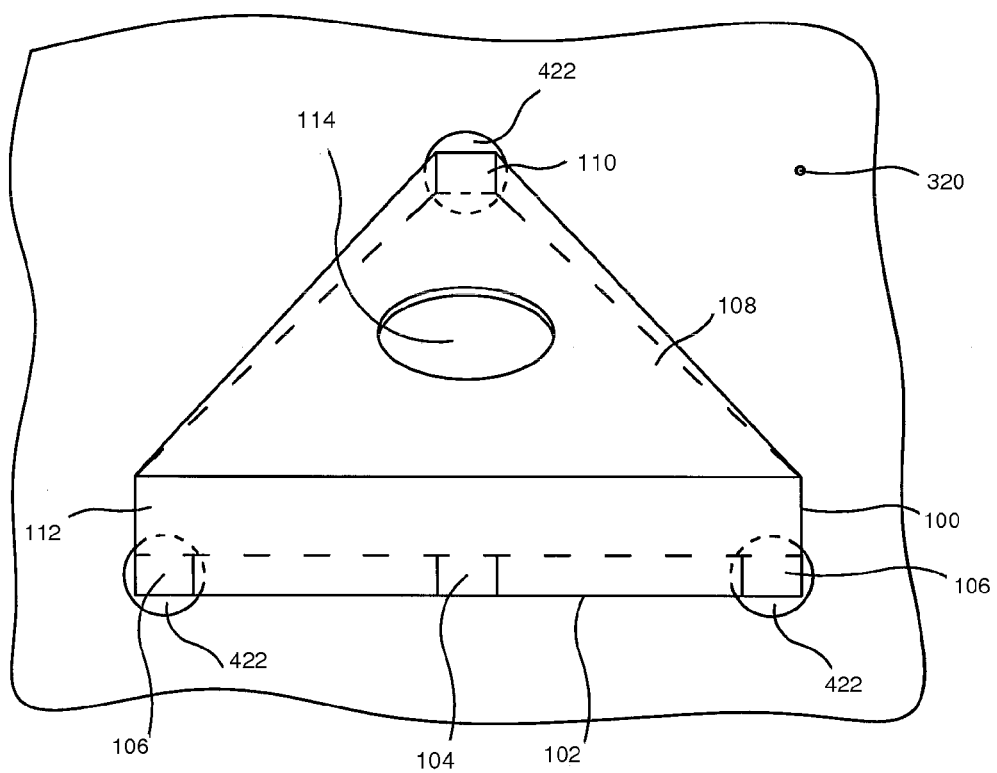
FIG. 4 illustrates a top view of the fastening element of FIG. 1 viewed from a direction indicated by arrow C in FIG. 1.
Figure 5:
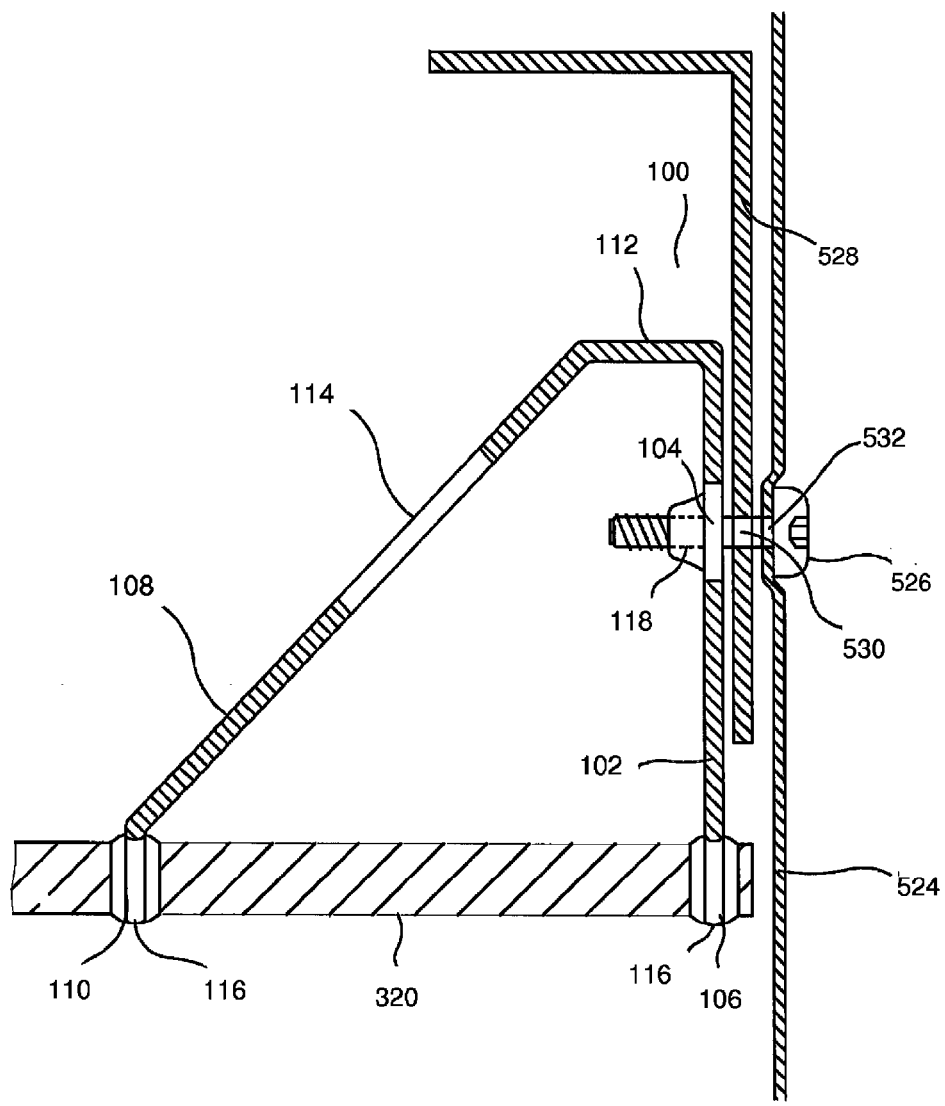
FIG. 5 illustrates one example of a connecting system using the fastening element shown in FIG. 1.

Two first mounting pins 106 extend from the first surface 102 for mounting the fastening element 100 to a printed circuit board (FIGS. 3-5). A second surface 108 is arranged substantially oblique to the first surface 102. A second mounting pin 110 extends from the second surface 108 for mounting the fastening element 100 to the printed circuit board. The two first mounting pins 106 and the second mounting pin 110 of the first surface 102 and the second surface 108 respectively, are extending parallel to each other. A third surface 112 connects the first surface 102 and the second surface 108. The third surface 112 comprises a planar section for providing a grasp or holding surface for a mounting tool for mounting the fastening element 100 to the printed circuit board. The second surface 108 comprises a through hole 114 aligned with the through hole 104 of the first surface 102 so that the through hole 114 of the second surface 108 is able to receive the connecting element projecting and extending through the through hole 104 of the first surface 102 as indicated by the dashed line in FIG. 1. In this regard, a long connecting element may abut against the second surface 108, so that the designers do not have to pay particularly close attention to the length of the connecting element and larger tolerances of material thicknesses and arrangements of the printed circuit board inside the housing may be permissible.

As illustrated in FIG. 1, the second surface 108 may have a triangular shape and the second mounting pin 110 may extend from an apex of the triangular-shaped second surface 108. An edge of the triangular-shaped second surface being opposed to the apex may then be connected with an edge of the third surface 112. The distal ends of the first and second mounting pins 106, 110 have tips 116. The three tips 116 define a plane that is substantially perpendicular to the first surface 102 of the fastening element 100. The third surface 112 is also substantially perpendicular to the first surface 102 and furthermore substantially parallel to the plane defined by the tips 116 and therefore parallel to the printed circuit board when the fastening element 100 is mounted on the printed circuit board. Such an arrangement of the mounting pins 106, 110 may increase the rigidity of the fastening element 100 when the fastening element 100 is mounted on the printed circuit board.

When mounted on a printed circuit board the fastening element 100 described above provides a solid and reliable fastening for connecting a printed circuit board to a housing. Due to the three mounting pins 106, 110 a reliable connection to the printed circuit board is provided. Together with the printed circuit board, the fastening element 100 provides a rigid structure so that the fastening element 100 stands the forces applied during manufacturing, such as the forces applied when the fastening element 100 receives a connecting element in the through hole 104, and in operation, when the electronic device comprising the printed circuit board is mounted for example in a car, where mechanical forces and vibrations are applied to the housing, the fastening element 100, and the printed circuit board. Although in the illustrated fastening element 100 three mounting pins 106, 110 are described, those skilled in the art will recognize that the fastening element 100 may be designed to have only one mounting pin 106 on the first surface 102. Alternatively, more than two mounting pins 106 may be positioned along the first surface 102. Similarly, the second surface 108 may also be designed to include more than one mounting pin 110 and to be of a shape other than a triangular shape.

Due to the existence of the third surface 112 being substantially parallel to the printed circuit board and providing a grasp surface for a mounting tool, the fastening element 100 can easily be mounted to the printed circuit board by a mounting tool or a robot, which may reduce the number of production steps and therefore the cost of production. Further, with the through hole 114 of the second surface 108 aligned with the through hole 104 of the first surface 102, connecting elements that extend through the second surface 108 in a mounted position may be utilized. Accordingly, the number of connecting elements with different lengths may be reduced by utilizing one or a few connecting elements with a standard length and therefore storage costs may also be reduced. Further, longer connecting elements can be used for balancing tolerances of the housing, the printed circuit board, or a shielding plate to be connected with the fastening element 100.

The through hole 104 of the first surface 102 provides an inner circumferential surface 118 providing an edge engaging an outer surface of the connecting element. The inner circumferential surface 118 can be provided with a thread for receiving a bolt or a machine screw as the connecting element, or the inner circumferential surface 118 is capable of receiving a thread-forming self-tapping screw as a connecting element. Furthermore, the through hole 104 of the first surface 102 can be provided with an insert nut for receiving a bolt or a machine screw as the connecting element. Due to the rigidity of the fastening element 100 various connecting elements, for example bolts, machine screws, thread-forming self-tapping screws, sheet metal screws and even rivets can be used as connecting elements, which provides a user with the flexibility of choosing the most appropriate and desired connecting element.

Figure 2:
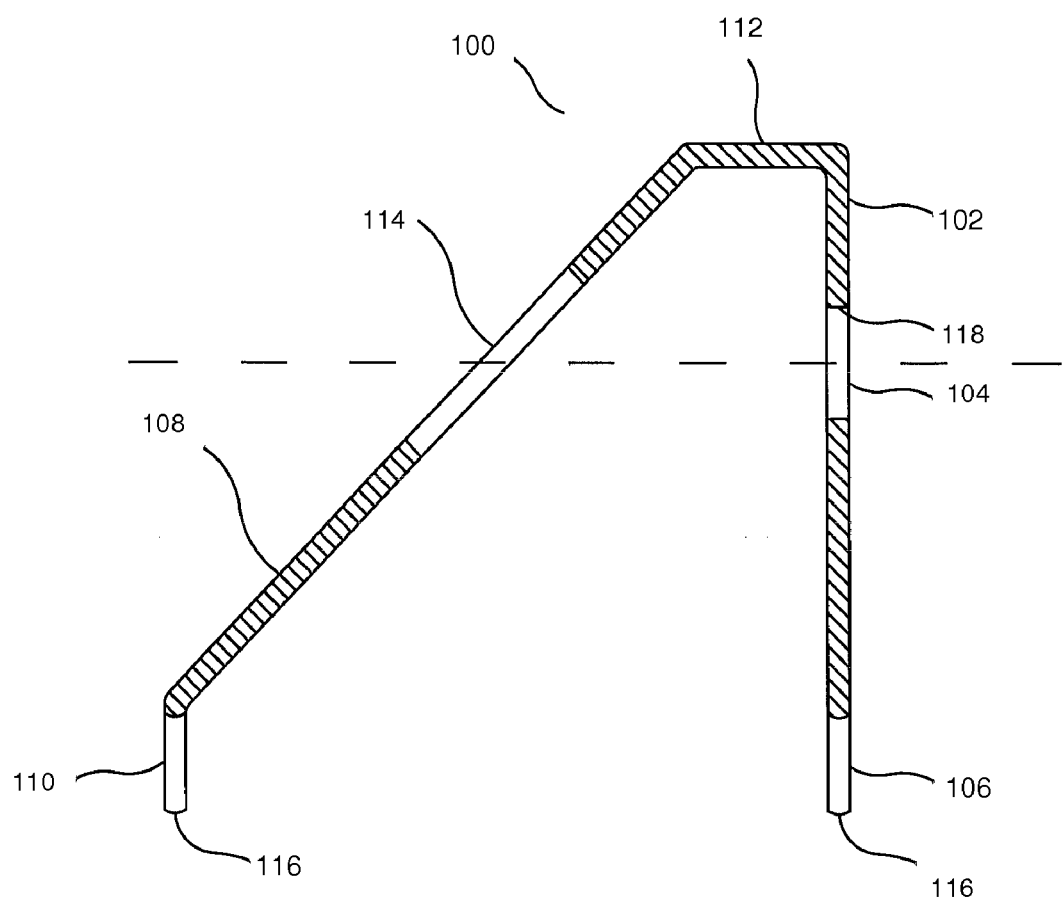
FIG. 2 illustrates a side view of the fastening element of FIG. 1 viewed in the direction of arrow A of FIG. 1.

FIG. 2 illustrates a side view of the fastening element 100 of FIG. 1 viewed in the direction of arrow A of FIG. 1. FIG. 2 illustrates (i) the arrangement of the mounting pins 106, 110 in parallel, (ii) the alignment of the through hole 104 of the first surface 102 and the through hole 114 of the second surface 108 indicated by the dashed line, (iii) the parallel arrangement of the third surface 112 and the plane defined by the tips 116 of the mounting pins 106, 110, (iv) the substantially perpendicular arrangement of the first surface 102 and the third surface 112, and (v) the substantially perpendicular arrangement of the first surface 102 and the plane defined by the tips 116 of the mounting pins 106, 110.

FIG. 3 illustrates a front view of the fastening element 100 of FIG. 1 viewed from the direction indicated by arrow B in FIG. 1. As illustrated in FIG. 3, the fastening element 100 is connected to a printed circuit board 320. The mounting pins 106, 110 are extending through holes in the printed circuit board 320 and can be fixed to the printed circuit board 320 by, for example, press fitting or soldering. In this view, the second surface 108 and through hole 114 are hidden behind the first surface 102, but indicated by dashed lines in FIG. 3. As can be seen in FIG. 3, the diameter of the through hole 114 of the second surface 108 is larger than the diameter of the through hole 104 of the first surface 102. This enables, when the connecting element extends through the through hole 114 of the second surface 108, the connecting element not to abut against the second surface 108, even if it is only approximately perpendicularly inserted in through hole 104 of the first surface 102.

FIG. 4 illustrates a top view of the fastening element 100 of FIG. 1 viewed from a direction indicated by arrow C in FIG. 1. As illustrated in FIG. 4, the fastening element 100 is connected to the printed circuit board 320 via the first mounting pins 106 and the second mounting pin 110 extending through holes 422 in the printed circuit board 320. By connecting the fastening element 100 to the printed circuit board 320 via three mounting pins 106, 110 defining a plane the fastening element 100 is able to impart forces in all directions received from the connecting element received in the through hole 104 of the first surface 102 to the printed circuit board 320. This may assure a reliable and rigid connection of a printed circuit board 320 to a housing.

As the third surface 112 is substantially parallel to the printed circuit board 320, the fastening element 100 can be grasped by a mounting tool and automatically mounted to the printed circuit board 320. In that the fastening element 100 is connected to the printed circuit board 320 via three mounting pins 106, 110 only, only a low positioning accuracy of the mounting tool may be required.

FIG. 5 illustrates one example of a connecting system using the fastening element 100 shown in FIG. 1. In particular, FIG. 5 shows a connecting system for connecting a printed circuit board 320 to a shielding plate 528 and a housing 524. A fastening element 100 as described above is connected with mounting pins 106, 110 to the printed circuit board 320. A first surface 102 of the fastening element 100 includes a through hole 104 for receiving a connecting element 526. The shielding plate 528 includes a through hole 530 for receiving the connecting element 526. A surface of the housing 524 also includes a through hole 532 for receiving the connecting element 526. The connecting element 526 may be a screw, a thread-forming self-tapping screw, a sheet metal screw, a bolt, or a machine screw, among other connecting elements 526.

After aligning the through hole 532 of the surface of the housing 524 with the through hole 530 of the shielding plate 528 and the through hole 104 of the first surface 102 of the fastening element 100, the connecting element 526 is inserted through the through holes 532, 530 and 104. The through hole 104 of the first surface 102 provides an inner circumferential surface 118 providing an edge engaging the outer surface of the connecting element 526. This engagement may be accomplished either by forming a thread in the through hole 104 before mounting the fastening element 100 to the printed circuit board 320, or by using a thread-forming self-tapping screw as the connecting element 526 and forming a thread in the through hole 104 of the first surface 102 during rotatively inserting the connecting element 526 in the through hole 104. The depicted connecting system provides a reliable connection between the printed circuit board 320 and the surface of the housing 524. Additionally, the shielding plate 528 may be fixed to the printed circuit board 320 and housing 524 respectively.

By sandwiching the shielding plate 528 between the first surface 102 and the surface of the housing 524, the shielding plate 528 is clamped with the connecting element 526 between the first surface 102 and the surface of the housing 524. Clamping of the shielding plate 528 enables a secure fixing of the shielding plate 528 without applying large forces to the shielding plate 528 as they would for example occur if the shielding plate 528 would be connected to a surface of the housing 528 by a thread-forming self-tapping screw forming a thread in the circumferential surface of the through hole 530 of the shielding plate 528. Therefore, also thin or sensitive materials can be used as shielding plates 528, for example thin metal sheets, plastic sheets, coated plastic sheets or multi-layered sheets comprising several metal or plastic sheets.

The fastening element 100 and the connecting element 526 may be made of metal. As such, an electrical connection can be provided between the housing 524, the shielding plate 528 and/or the printed circuit board 320. Therefore, this connecting system may provide not only a mechanical connection between the printed circuit board 320 and the housing 524, but also, if desired, an electrical connection between the printed circuit board 320, the shielding plate 528, and the housing 524, for example, for a ground connection of the three components 320, 528, 524. On the other hand, the connecting system may provide, if the shielding plate 528 is an isolating shielding plate made, for example, of a plastic sheet, a fixing of isolating shielding plates within the housing 524 between the printed circuit board 320 and the housing 524, or between several stacked printed circuit boards 320.

In production, the fastening element 100 may be mounted to the printed circuit board 320 by arranging the surface of the housing 524, the shielding plate 528 and one surface 102 of the fastening element 100 substantially perpendicular to the printed circuit board 320 to form a layered structure so that the shielding plate 528 is sandwiched between the surface of the housing 524 and the surface 102 of the fastening element 100 and aligning the surface of the housing 524, the shielding plate 528 and the fastening element 100 so that through holes 532, 530, 104 of the surface of the housing 524, the shielding plate 528 and the surface 102, respectively, of the fastening element 100 form one through hole through the layered structure. The housing 524, the shielding plate 528 and the fastening element 100 may be then be releaseably secured together with a connecting element 526 passing through the one through hole of the layered structure.

As previously discussed, the fastening element 100 provides a grasping surface on its third surface 112. Therefore, the production steps of mounting the fastening element 100 to the printed circuit board 320, arranging the shielding plate 528 and the surface of the housing 524 substantially perpendicular to the printed circuit board 320, aligning the through holes 104, 530, 532 of the first surface 102 of the fastening element 100, the shielding plate 528, and the surface of the housing 524, respectively, and inserting the connecting element 526 can be performed automatically by a manipulator or a robot.

Furthermore, with a connection system as defined above, the housing 524, the shielding plate 528, and the printed circuit board 320 can be releasably connected within one production step. As the connecting element 526 engages the fastening element 100, the shielding plate 528 can be attached without applying mechanical forces that could damage the shielding plate 528. As the fastening element 100 provides a solid receiver for the connecting element 526 and the fastening element 100 is automatically mountable to the printed circuit board 320, the whole production process can be automatically performed by a manipulator or robot. By arranging the shielding plate 528 sandwiched between the surface of the housing 524 and the surface 102 of the fastening element 100 the mechanical load on the shielding plate 528 may be reduced compared to a shielding plate 528 that is directly fixed with a screw.

Additionally, as the connecting system is able to cooperate with such a wide variety of connecting elements 526 of different kinds, diameters and lengths, the connecting system can be used in many areas and the most appropriate connecting element 526 may be chosen for the connecting systems of a device and therefore the variety of connecting elements 526 within one device can be reduced.

The foregoing description of implementations has been presented for purposes of illustration and description. It is not exhaustive and does not limit the claimed inventions to the precise form disclosed. Modifications and variations are possible in light of the above description or may be acquired from practicing the invention. The claims and their equivalents define the scope of the invention.

What is claimed is:

1. A fastening element for connecting at least a housing to a printed circuit board, the fastening element comprising:
   a first surface having a through hole for receiving a connecting element for connecting the fastening element to the housing; and
   a second surface from which a second mounting pin extends for mounting the fastening element to the printed circuit board,
   at least one first mounting pin extending from the first surface for mounting the fastening element to the printed circuit board; and
   a third surface connecting the first and the second surfaces, the third surface having a planar section providing a grasp surface for a mounting tool for mounting the fastening element to the printed circuit board.

2. The fastening element of claim 1, where the second surface extends substantially oblique to the first surface, the at least one first and the second mounting pins of both surfaces extending parallel to each other.

3. The fastening element of claim 1, where the third surface is substantially perpendicular to the first surface.

4. The fastening element of claim 1, where the third surface is substantially parallel to the printed circuit board when the fastening element is mounted to the printed circuit board.

5. The fastening element of claim 1, where the second surface has a triangular shape, the second mounting pin extending from an apex of the triangular-shaped second surface and an edge of the triangular shaped second surface being opposed to the apex is connected with an edge of the third surface.

6. The fastening element of claim 1, where the second surface includes a through hole aligned with the through hole of the first surface so that the through hole of the second surface is able to receive the connecting element projecting and extending through the through hole of the first surface.

7. The fastening element of claim 1, where two first mounting pins and the second mounting pin of the fastening element are arranged substantially in parallel and such that tips of the pins are lying in a plane substantially perpendicular to the first surface of the fastening element.

8. The fastening element of claim 1, where the through hole of the first surface provides an inner circumferential surface providing an edge engaging an outer surface of the connecting element.

9. The fastening element of claim 8, where the inner circumferential surface of the through hole of the first surface is provided with a thread.

10. The fastening element of claim 8, where the edge of the inner circumferential surface of the through hole of the first surface is capable of receiving a thread-forming self-tapping screw.

11. A connecting system for connecting a printed circuit board to a shielding plate and a housing, the connecting system comprising:
    the housing having a through hole for receiving a connecting element;
    the shielding plate having a through hole for receiving the connecting element; and
    a fastening element, the fastening element comprising:
    a first surface having a through hole for receiving the connecting element for connecting the fastening element to the housing; and
    a second surface from which a second mounting pin extends for mounting the fastening element to the printed circuit board,
    at least one first mounting pin extending from the first surface for mounting the fastening element to the printed circuit board; and
    a third surface connecting the first and the second surfaces, the third surface having a planar section providing a grasp surface for a mounting tool for mounting the fastening element to the printed circuit board.

12. The connecting system of claim 11, where at least two of the housing, the shielding plate, and the fastening element are electrically connected via the connecting element.

13. The connecting system of claim 11, where the connecting element consists of one of the following: a rivet, a screw, a thread-forming self-tapping screw, a sheet metal screw, a bolt, and a machine screw.

14. The connecting system of claim 11, where the shielding plate consists of either or both at least one metal sheet or at least one plastic sheet.

15. The connecting system of claim 11, where the shielding plate is sandwiched between the housing and the fastening element.

16. The connecting system of claim 11, where the mounting pins of the fastening element are fixed at the printed circuit board by soldering.

17. A method for connecting a housing, a shielding plate and a printed circuit board, the method comprising the steps of:
    mounting a fastening element to the printed circuit board;
    arranging a surface of the housing, the shielding plate and a first surface of the fastening element to form a layered structure so that the shielding plate is sandwiched between the surface of the housing and the first surface of the fastening element;
    aligning the surface of the housing, the shielding plate and the fastening element so that through holes of the surface of the housing, the shielding plate and the first surface of the fastening element form one through hole through the layered structure; and
    connecting the surface of the housing, the shielding plate and the fastening element with a connecting element passing through the one through hole of the layered structure, where the fastening element comprises:
    the first surface having the through hole for receiving the connecting element for connecting the fastening element to the housing; and
    a second surface from which a second mounting pin extends for mounting the fastening element to the printed circuit board,
    at least one first mounting pin extending from the first surface for mounting the fastening element to the printed circuit board; and
    a third surface connecting the first and the second surfaces, the third surface having a planar section providing a grasp surface for a mounting tool for mounting the fastening element to the printed circuit board.

18. The method of claim 17, where the fastening element is mounted to the printed circuit board such that the first surface of the fastening element, the shielding plate, and the surface of the housing are perpendicular to the printed circuit board.

19. The method of claim 17, where at least three mounting pins of the fastening element for mounting the fastening element to the printed circuit board are arranged substantially in parallel and such that tips of the pins are lying in a plane substantially perpendicular to the first surface of the fastening element.

20. The method of claim 17, additionally comprising the step of soldering the fastening element to the printed circuit board after the step of the mounting of the fastening element to the printed circuit board.

21. The method of claim 17, where the connecting element comprises a screw and the step of connecting the surface of the housing, the shielding plate and the fastening element comprises the screwing of the screw through the surface of the housing, the shielding plate and the first surface of fastening element.

22. The method of claim 17, where at least one of the steps of the mounting, arranging, aligning and connecting is performed automatically by a manipulator or a robot.

* * * * *

UNITED STATES PATENT AND TRADEMARK OFFICE
CERTIFICATE OF CORRECTION

| | |
|---|---|
| PATENT NO. | : 7,800,911 B2 |
| APPLICATION NO. | : 11/782089 |
| DATED | : September 21, 2010 |
| INVENTOR(S) | : Rieger |

It is certified that error appears in the above-identified patent and that said Letters Patent is hereby corrected as shown below:

At column 8, line 61, claim 18 "of the housing arc perpendicular..." should be changed to "of the housing are perpendicular..."

Signed and Sealed this
Eighth Day of March, 2011

David J. Kappos
*Director of the United States Patent and Trademark Office*